United States Patent
Zhang et al.

(10) Patent No.: US 12,306,547 B2
(45) Date of Patent: May 20, 2025

(54) METHOD FOR MEASURING STITCHING OVERLAY ACCURACY OF IMAGE SENSOR STITCHING MANUFACTURING

(71) Applicant: Shanghai Huali Microelectronics Corporation, Shanghai (CN)

(72) Inventors: Yu Zhang, Shanghai (CN); Xiaobin Zhu, Shanghai (CN); Xiaolong Wang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 473 days.

(21) Appl. No.: 17/893,425

(22) Filed: Aug. 23, 2022

(65) Prior Publication Data

US 2023/0120126 A1 Apr. 20, 2023

(30) Foreign Application Priority Data

Sep. 29, 2021 (CN) .......................... 202111149879.2

(51) Int. Cl.
*G03F 7/20* (2006.01)
*G03F 7/00* (2006.01)
*H01L 27/146* (2006.01)
*H10F 39/00* (2025.01)

(52) U.S. Cl.
CPC ...... *G03F 7/70633* (2013.01); *G03F 7/70475* (2013.01); *H10F 39/011* (2025.01)

(58) Field of Classification Search
CPC ............. G03F 7/70633; G03F 7/70475; H01L 27/14683; H10F 39/011
See application file for complete search history.

(56) References Cited

U.S. PATENT DOCUMENTS

2006/0210893 A1* 9/2006 Van Bilsen ......... G03F 7/70633 700/121

* cited by examiner

*Primary Examiner* — Walter H Swanson
(74) *Attorney, Agent, or Firm* — Banner & Witcoff, Ltd.

(57) ABSTRACT

The present application discloses a method for measuring stitching overlay accuracy of image sensor stitching manufacturing, forming an A-type overlay pattern mark and a corresponding B-type overlay pattern mark on the edge of each rectangular pixel area to be stitched; after the A-type overlay pattern mark and the B-type overlay pattern mark are stitched and exposed, performing metrology by means of a scanning electron microscope to obtain dimension features; and according to the dimension features of the A-type overlay pattern mark and the B-type overlay pattern mark stitched together and exposed and measured by the scanning electron microscope, determining stitching overlay accuracy of two adjacent rectangular pixel areas. The present application can achieve direct metrology on the overlay pattern mark on the stitched pixel area of a product, facilitating timely and accurate monitoring on the stitching overlay accuracy of image sensor stitching manufacturing.

10 Claims, 5 Drawing Sheets

METHOD FOR MEASURING STITCHING OVERLAY ACCURACY OF IMAGE SENSOR STITCHING MANUFACTURING

CROSS-REFERENCES TO RELATED APPLICATIONS

This application claims the priority to Chinese Patent Application No. 202111149879.2, filed on Sep. 29, 2021, the disclosure of which is incorporated herein by reference in entirety.

TECHNICAL FIELD

The present application relates to semiconductor manufacturing technologies, in particular to a method for measuring stitching overlay accuracy of image sensor stitching manufacturing.

BACKGROUND

The CMOS image sensors (CISs) used every year gradually increases, due to the compatibility of the manufacturing process thereof with the existing integrated circuit manufacturing process and many advantages of the performance thereof compared to the original charge coupled device (CCD). The CMOS image sensor can integrate the drive circuit and the pixel together. Since the electrical signal can be taken out while collecting the optical signal, the image information can be processed in real time, and the speed is much faster than that of the CCD image sensor. The CMOS image sensor can integrate a drive circuit and pixels together, and can output an electrical signal while acquiring an optical signal, thereby processing image information in real time, with a speed much faster than that of the CCD image sensor. The CMOS image sensor has many other advantages such as low price, large bandwidth, anti-blur, access flexibility, and relatively large fill factor.

The CMOS image sensor is composed of a pixel cell circuit and a CMOS circuit. The pixel cell circuit is located in a pixel area, and the CMOS circuit is a logic circuit located in a logic area. Compared with the CCD image sensor, the CMOS image sensor has a higher integration degree due to a CMOS standard manufacturing process, can be integrated with other digital-analog operation and control circuits on the same chip, and thus is more applicable to future development. According to the number of transistors included in the pixel cell circuit of the existing CMOS image sensor, the existing CMOS image sensors are mainly classified into a 3T-type structure and a 4T-type structure.

The high-resolution compound imaging technology (>100 million pixels) is substantially implemented on 12-inch silicon wafers, and requires manufacturers to adopt higher-order design rules to improve the fill factor of a pixel cell, including excellent movement accuracy of lithography tools and uniformity of critical dimensions as well as programming software with image definition and assignment tasks. Currently only a few companies in the world have a monopoly on this process technology. At present, the size of the largest single sensor that can be made on a 12-inch wafer is about 205*205 mm, with about 1.5 billion pixels.

At present, image sensors have been widely developed and applied in various fields. Some special fields such as astronomical telescopes, full frame digital cameras, medical imaging, and other professional imaging application fields require large-sized image sensors. Since these large-sized image sensors have sizes exceeding the 26*33 mm image field of a lithography machine, the stitching technology is required in the manufacturing process. The manufacturing of super-large image sensors requires a stitching process, stitching the pixel areas several times or even dozens of times to form a super-large pixel area, and finally forming a large-sized image sensor by stitching.

The overlay accuracy in the pixel area stitching process is one of the most critical technical indicators. Generally, the control on the stitching overlay accuracy, referring to FIG. 1, requires a conventional stitching overlay mark 11 placed on the edge of a pixel area 10 of a product. After the stitching and exposure of all the pixel areas of the product are completed (referring to FIG. 2), metrology is performed for these conventional stitching overlay marks 11, and machine movement accuracy compensation is performed subsequently to satisfy the requirement of the stitching overlay accuracy.

Referring to FIG. 3, the conventional stitching overlay mark 11 is composed of an inner frame and an outer frame with a width of about 40 μm, and has a relatively large area. In the stitching of a super-large image sensor, since the pixel areas 10 are repeating patterns, it is impossible to place the conventional stitching overlay mark 11 having an excessively large area on the edge. Therefore, the following method is adopted. First, a test mask is published, wherein the stitching manner and exposure process of the test mask are the same as those of a product, and as the test mask has no product patterns, the conventional stitching overlay mark having a relatively large area can be placed on the edge. Then, after the test mask is exposed and spliced in the same way as the product on the test wafer, the overlay accuracy of the test mask is measured to estimate the overlay accuracy of the product. The relatively large conventional stitching overlay marks are respectively placed on the left edge, right edge, upper edge, and lower edge of the test mask. It the stitching is accurate, after the stitching and exposure processes, the centers of the conventional stitching overlay mark on the right edge of a left test mask and the conventional stitching overlay mark on the left edge of a right test mask should coincide (a left test mask and a right test mask are left-right stitched together), and the centers of the conventional stitching overlay mark on the lower edge of an upper test mask and the conventional stitching overlay mark on the upper edge of a lower test mask should coincide (an upper test mask and a lower test mask are upper-lower stitched together). Referring to FIG. 4, in the overlay accuracy of the pixel area stitching process, a left-right inflation error magX may be obtained from a difference between the X-axis coordinate of the conventional stitching overlay mark on the right edge of the left test mask and the X-axis coordinate of the conventional stitching overlay mark on the left edge of the right test mask, after the stitching and exposure processes; a left-right rotation error rotY may be obtained from the central point coordinates $(x_1, y_1)$ of the conventional stitching overlay mark on the right edge of the left test mask (e.g., P1) for left-right stitching and the central point coordinates $(x_2, y_2)$ of the conventional stitching overlay mark on the left edge of the right test mask (e.g., P2), after the stitching and exposure processes, wherein rotY= $\sqrt{(x_1^2-x_2^2)^2+(y_1^2-y_2^2)^2}$; an upper-lower inflation error magY may be obtained from a difference between the Y-axis coordinate of the conventional stitching overlay mark on the lower edge of the upper test mask and the Y-axis coordinate of the conventional stitching overlay mark on the upper edge of the lower test mask, after the stitching and exposure processes; and an upper-lower rotation error rotX may be obtained from the coordinates $(x_3, y_3)$ of the conventional stitching overlay mark on the lower edge of the upper test mask (e.g., P3) and the coordinates $(x_1, y_1)$ of the conventional stitching overlay mark on the upper edge of the lower test mask (e.g., P1), after the stitching and exposure processes, wherein $rotX=\sqrt{(x_1^2-x_2^2)^2+(y_1^2-y_2^2)^2}$.

In this method, the overlay accuracy of the product is estimated indirectly from the overlay accuracy of the test mask on the wafer, having the following disadvantage: the overlay accuracy is affected by factors such as mask, wafer, process, etc., leading to uncertainty and the impossibility of direct metrology on the product.

BRIEF SUMMARY

The technical problem to be solved by the present application is providing a method for measuring stitching overlay accuracy of image sensor stitching manufacturing, so as to achieve direct metrology on an overlay pattern mark on a stitched pixel area of a product, facilitating timely and accurate monitoring on the stitching overlay accuracy of image sensor stitching manufacturing and keeping the entire pattern of the pixel area natural.

In order to solve the above technical problems, the method for measuring stitching overlay accuracy of image sensor stitching manufacturing provided by the present application includes the following steps:

step 1, forming at least two rectangular pixel areas, wherein:

at least one A-type overlay pattern mark is formed on the upper edge of each pixel area, and at least one B-type overlay pattern mark is formed on the lower edge corresponding to the upper edge, at least one A-type overlay pattern mark is formed on the left edge, and at least one B-type overlay pattern mark is formed on the right edge corresponding to the left edge;

the A-type overlay pattern mark includes two A-type side strips and N A-type intermediate strips, N being an integer greater than 1;

the two A-type side strips and N A-type intermediate strips are arranged in parallel;

the two A-type side strips are arranged on two sides of the N A-type intermediate strips;

the A-type side strip is composed of a body and a head connected together;

the body is located on a side close to the pixel area center;

the head is rectangular and located on a side far away from the pixel area center;

the width of the head is greater than the width of the body;

distances from the heads of the two A-type side strips to the A-type intermediate strips adjacent to the two A-type side strips are equal;

intervals between the A-type intermediate strips are equal;

ends of the A-type intermediate strips on the side far away from the pixel area center are aligned and located between the heads of the two A-type side strips;

the B-type overlay pattern mark is configured to cooperate with the A-type overlay pattern mark and includes two B-type side strips and N B-type intermediate strips;

the two B-type side strips and N B-type intermediate strips are arranged in parallel;

the two B-type side strips are arranged on two sides of the N B-type intermediate strips;

ends of the B-type intermediate strips on the side far away from the pixel area center are aligned;

an interval between the B-type intermediate strips is equal to the interval between the A-type intermediate strips; and distances E from the bodies of the two A-type side strips to the A-type intermediate strips adjacent to the two A-type side strips are equal to distances from the two B-type side strips to the B-type intermediate strips adjacent to the two B-type side strips;

step 2, performing left-right stitching and/or upper-lower stitching on a plurality of rectangular pixel areas, so that the A-type overlay pattern mark on the edge of two adjacent rectangular pixel areas is stitched to the corresponding B-type overlay pattern mark, wherein the heads of the two A-type side strips are in one-to-one correspondence with and stitched to ends of the two B-type side strips on the side far away from the pixel area center, with overlap areas, and the ends of the N A-type intermediate strips on the side far away from the pixel area center are in one-to-one correspondence with and stitched to the ends of the N B-type intermediate strips on the side far away from the pixel area center, with overlap areas; and then forming a pattern after exposure; and step 3, performing, by means of a scanning electron microscope, metrology on the A-type overlay pattern mark and B-type overlay pattern mark that are stitched together and exposed, so as to obtain a distance K from the head of one of the A-type side strips to the B-type intermediate strip adjacent to the A-type side strip and a distance C from the head of the other A-type side strip to the B-type intermediate strip adjacent to the A-type side strip; and according to the distances from the head of the two A-type side strips to the B-type intermediate strips adjacent to the A-type side strips, calculating stitching overlay accuracy OVL:OVL=K−C of the two adjacent rectangular pixel areas, wherein:

when the left-right stitching is performed on the two adjacent rectangular pixel areas, OVL is overlay accuracy of the left-right stitching; and when the upper-lower stitching is performed on the two adjacent rectangular pixel areas, OVL is overlay accuracy of the upper-lower stitching.

In some examples, before the stitching and exposure, the width of the A-type intermediate strip, the width D1 of the body of the A-type side strip, the width of the B-type intermediate strip, and the width D2 of the B-type side strip are 1-2 times of a critical dimension of a process of preparing the rectangular pixel area.

In some examples, N is 2, 3, 4, or 5.

In some examples, in step 3, by performing, by means of the scanning electron microscope, the metrology on the A-type overlay pattern mark and B-type overlay pattern mark that are stitched together and exposed, a distance A1 between the adjacent A-type intermediate strips and a distance B1 between the adjacent B-type intermediate strips are also obtained, and OVL=K−C−(A1−B1).

In some examples, before the stitching and exposure, the width of the A-type intermediate strip, the width D1 of the body of the A-type side strip, the width of the B-type intermediate strip, and the width D2 of the B-type side strip are equal.

In some examples, before the stitching and exposure, the end of each B-type intermediate strip on the side far away from the pixel area center is located on a side of the two B-type side strips far away from the pixel area center.

In some examples, before the stitching and exposure, the end of each B-type intermediate strip on the side far away from the pixel area center is farther away from the pixel area center compared with the end of the B-type side strip on the side far away from the pixel area center, and a distance F from the end of each B-type intermediate strip on the side far away from the pixel area center to the end of the B-type side strip on the side far away from the pixel area center is equal to ½ of the length H of the head of the A-type side strip.

In some examples, before the stitching and exposure, the widths of the bodies of the two A-type side strips and the width of each A-type intermediate strip are equal; and ends of the two A-type side strips and N A-type intermediate strips close to the pixel area center are aligned.

In some examples, before the stitching and exposure, the width I of the head of the A-type side strip is 2-5 times the width D1 of the body of the A-type side strip.

In some examples, before the stitching and exposure, the ends of the A-type intermediate strips on the side far away from the pixel area center are aligned and correspond to middle positions on the heads of the two A-type side strips, that is, a distance G from the end of the A-type intermediate strip on the side far away from the pixel area center to the end of the head of the A-type side strip on the side close to the pixel area center is ½ of the length H of the head of the A-type side strip.

In the method for measuring stitching overlay accuracy of image sensor stitching manufacturing of the present application, the A-type overlay pattern mark and the corresponding B-type overlay pattern mark are formed on the edge of each rectangular pixel area to be stitched, so as to replace the conventional overlay mark. After the new A-type overlay pattern mark and B-type overlay pattern mark are stitched and exposed, the metrology may be performed by means of a scanning electron microscope to obtain dimension features, so that stitching overlay accuracy of two adjacent rectangular pixel areas may be determined according to the dimension features of the A-type overlay pattern mark and the B-type overlay pattern mark stitched together and exposed and measured by the scanning electron microscope. The method for measuring stitching overlay accuracy of image sensor stitching manufacturing can achieve direct metrology on the overlay pattern mark on the stitched pixel area of a product, facilitating timely and accurate monitoring on the stitching overlay accuracy of image sensor stitching manufacturing and more accurately and efficiently providing a predicted value of an overlay model of a super large image sensor. In addition, since basis patterns of the A-type overlay pattern mark and the corresponding B-type overlay pattern mark formed on the edge of each rectangular pixel area to be stitched are strip-shaped, patterns of wires at the edge of the same pixel area are consistent, thereby keeping the entire pattern of the pixel area natural.

BRIEF DESCRIPTION OF THE DRAWINGS

In order to more clearly explain the technical solutions of the present application, the drawings required by present application are briefly described below. It is obvious that the drawings described below are merely some embodiments of the present application, and those skilled in the art could also obtain other drawings on the basis of these drawings, without involving any inventive skill.

DETAILED DESCRIPTION OF THE DISCLOSURE

The technical solutions of the present application will be clearly and completely described below with reference to the drawings. Obviously, the described embodiments are part of the embodiments of the present application, rather than all of them. Based on the embodiments in the present application, all other embodiments obtained by those skilled in the art without involving any inventive skill shall fall into the protection scope of the present application.

Embodiment 1

A method for measuring stitching overlay accuracy of image sensor stitching manufacturing includes the following steps.

Step 1. At least two rectangular pixel areas are formed.

At least one A-type overlay pattern mark is formed on the upper edge of each pixel area, and at least one B-type overlay pattern mark is formed on the lower edge corresponding to the upper edge, at least one A-type overlay pattern mark is formed on the left edge, and at least one B-type overlay pattern mark is formed on the right edge corresponding to the left edge.

Figure 1:
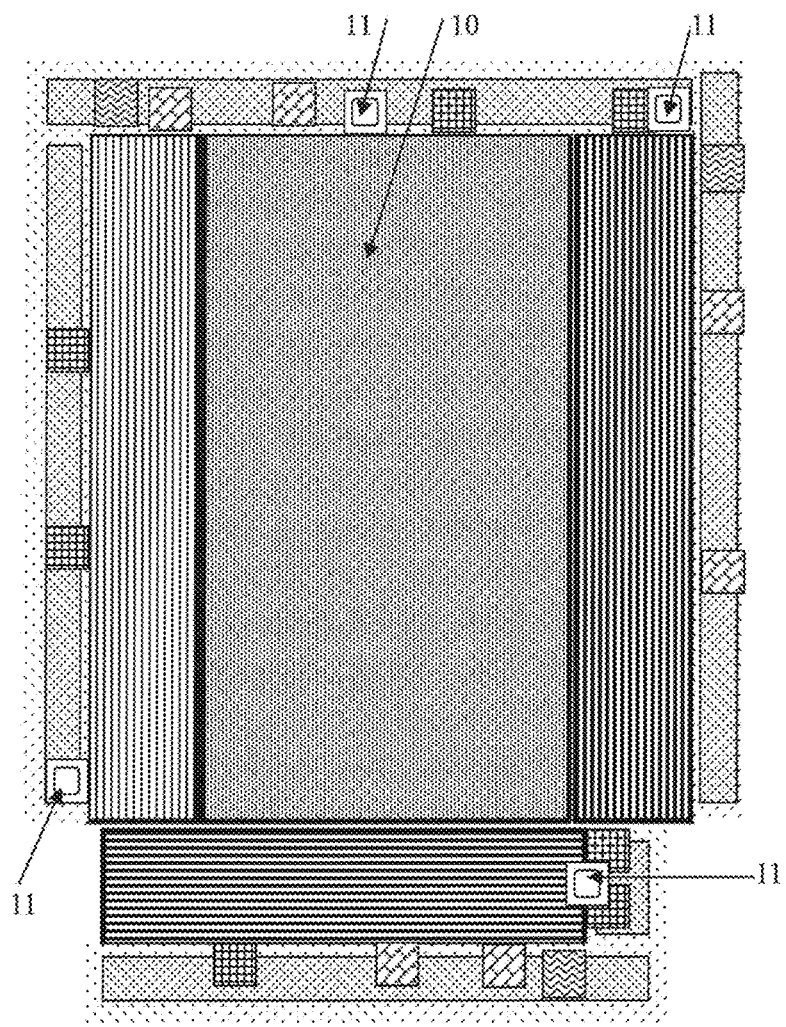
FIG. 1 is a schematic diagram of a product pixel area with conventional stitching overlay marks placed on the edge thereof.
Figure 2:
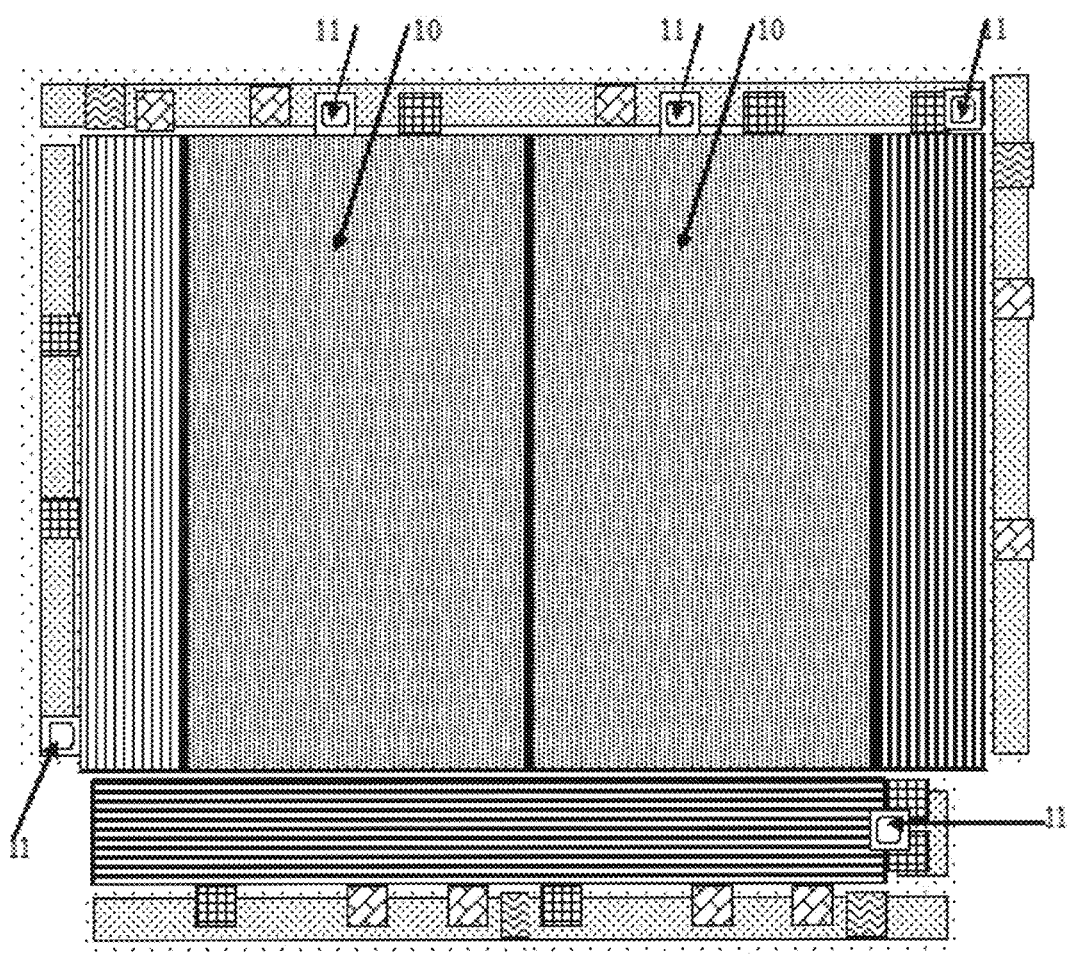
FIG. 2 is a schematic diagram of two product pixel areas with conventional stitching overlay marks placed on the edge thereof and undergoing left-right stitching and exposure.
Figure 3:
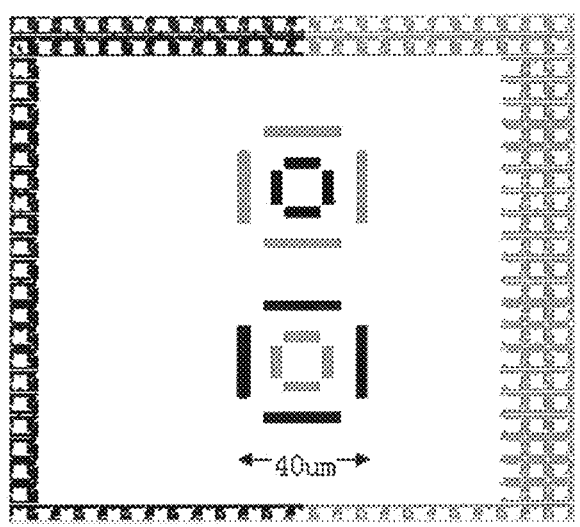
FIG. 3 is a schematic diagram of the conventional stitching overlay marks on two test masks with conventional stitching overlay marks placed on the edge thereof and undergoing left-right stitching and exposure.
Figure 4:
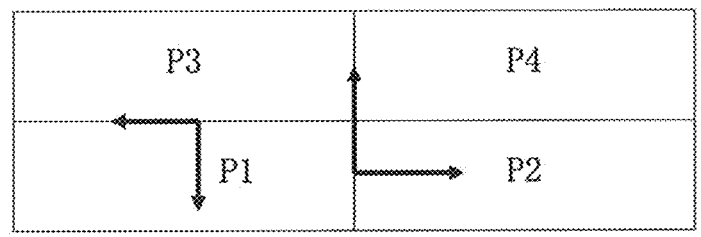
FIG. 4 is a schematic diagram of a method for determining stitching overlay accuracy of the stitched and exposed test masks with conventional stitching overlay marks placed on the edge thereof.
Figure 5:
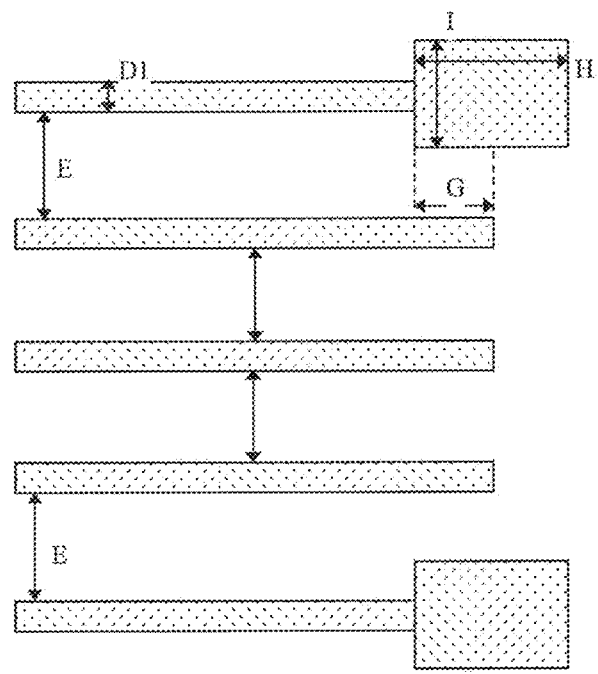
FIG. 5 is a schematic diagram of an A-type overlay pattern mark in a method for measuring stitching overlay accuracy of image sensor stitching manufacturing according to an embodiment of the present application.

Referring to FIG. 5, the A-type overlay pattern mark includes two A-type side strips and N A-type intermediate strips, N being an integer greater than 1.

The two A-type side strips and N A-type intermediate strips are arranged in parallel.

The two A-type side strips are arranged on two sides of the N A-type intermediate strips.

The A-type side strip is composed of a body and a head connected together.

The body is located on a side close to the pixel area center.

The head is rectangular and located on a side far away from the pixel area center.

The width of the head is greater than the width of the body.

Distances from the heads of the two A-type side strips to the A-type intermediate strips adjacent to the two A-type side strips are equal.

Intervals between the A-type intermediate strips are equal.

Ends of the A-type intermediate strips on the side far away from the pixel area center are aligned and located between the heads of the two A-type side strips.

Figure 6:
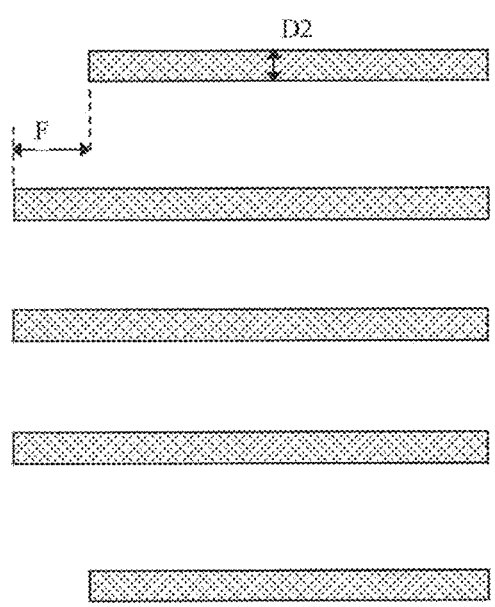
FIG. 6 is a schematic diagram of a B-type overlay pattern mark in the method for measuring stitching overlay accuracy of image sensor stitching manufacturing according to an embodiment of the present application.

Referring to FIG. 6, the B-type overlay pattern mark is configured to cooperate with the A-type overlay pattern mark and includes two B-type side strips and N B-type intermediate strips.

The two B-type side strips and N B-type intermediate strips are arranged in parallel.

The two B-type side strips are arranged on two sides of the N B-type intermediate strips.

Ends of the B-type intermediate strips on the side far away from the pixel area center are aligned.

An interval between the B-type intermediate strips is equal to the interval between the A-type intermediate strips.

Distances E from the bodies of the two A-type side strips to the A-type intermediate strips adjacent to the two A-type side strips are equal to distances from the two B-type side strips to the B-type intermediate strips adjacent to the two B-type side strips.

Step 2. Left-right stitching and/or upper-lower stitching are performed on a plurality of rectangular pixel areas, so that the A-type overlay pattern mark on the edge of two adjacent rectangular pixel areas is stitched to the corresponding B-type overlay pattern mark, wherein the heads of the two A-type side strips are in one-to-one correspondence with and stitched to ends of the two B-type side strips on the side far away from the pixel area center, with overlap areas, and the ends of the N A-type intermediate strips on the side far away from the pixel area center are in one-to-one correspondence with and stitched to the ends of the N B-type intermediate strips on the side far away from the pixel area center, with overlap areas; and then a pattern is formed after exposure.

Step 3. Metrology is performed, by means of a scanning electron microscope, on the A-type overlay pattern mark and B-type overlay pattern mark that are stitched together and exposed, so as to obtain a distance K from the head of one of the A-type side strips to the B-type intermediate strip adjacent to the A-type side strip and a distance C from the head of the other A-type side strip to the B-type intermediate strip adjacent to the A-type side strip; and according to the distances from the head of the two A-type side strips to the B-type intermediate strips adjacent to the A-type side strips, calculating stitching overlay accuracy OVL:OVL=K−C of the two adjacent rectangular pixel areas.

When the left-right stitching is performed on the two adjacent rectangular pixel areas, OVL is overlay accuracy of the left-right stitching.

When the upper-lower stitching is performed on the two adjacent rectangular pixel areas, OVL is overlay accuracy of the upper-lower stitching.

In some examples, N is 2, 3, 4, or 5 (e.g., N is 3).

In some examples, before the stitching and exposure, the width of the A-type intermediate strip, the width D1 of the body of the A-type side strip, the width of the B-type intermediate strip, and the width D2 of the B-type side strip are 1-2 times of a critical dimension of a process of preparing the rectangular pixel area.

Figure 7:
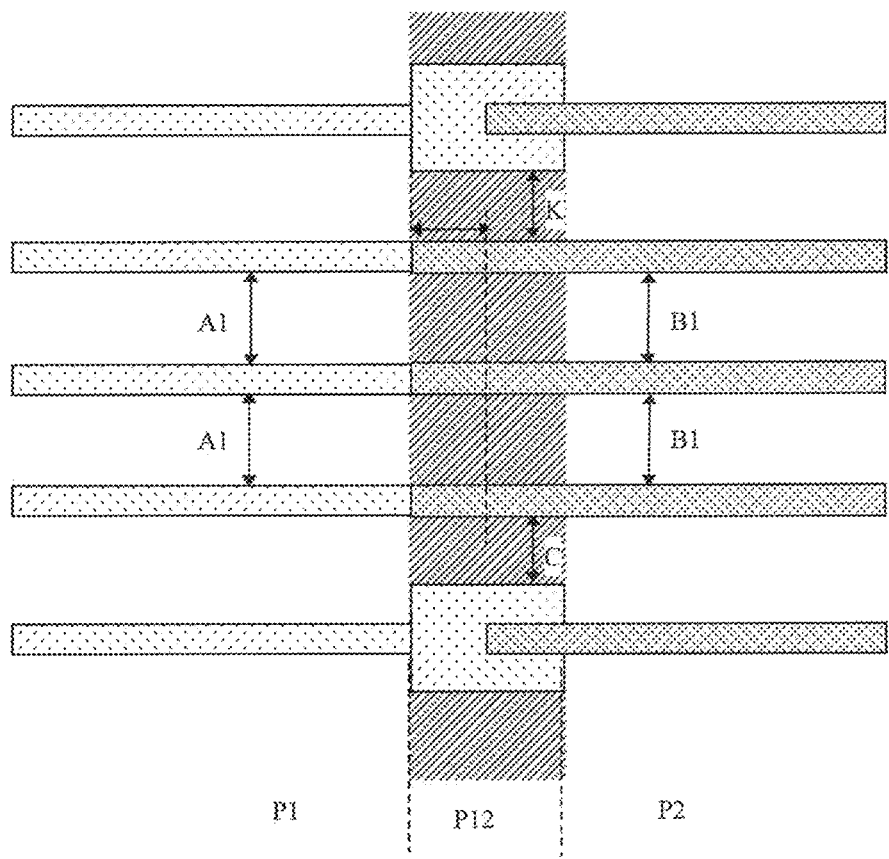
FIG. 7 is a schematic diagram of a joint of left-right stitching between two adjacent rectangular pixel areas in the method for measuring stitching overlay accuracy of image sensor stitching manufacturing according to an embodiment of the present application.

FIG. 7 is a schematic diagram of a joint of the left-right stitching of the two adjacent rectangular pixel area. A schematic diagram of the upper-lower stitching of the two adjacent rectangular pixel area can be obtained by rotating FIG. 7 90 degrees. The pixel area P1 and the pixel area P2 are identical, and a shaded portion with dashed lines is a repeat exposure area P12, i.e., a stitching area. A super large image sensor is usually formed by stitching dozens of rectangular pixel areas.

In the method for measuring stitching overlay accuracy of image sensor stitching manufacturing of embodiment 1, the A-type overlay pattern mark and the corresponding B-type overlay pattern mark are formed on the edge of each rectangular pixel area to be stitched, so as to replace the conventional overlay mark. After the new A-type overlay pattern mark and B-type overlay pattern mark are stitched and exposed, the metrology may be performed by means of a scanning electron microscope to obtain dimension features, so that stitching overlay accuracy of two adjacent rectangular pixel areas may be determined according to the dimension features of the A-type overlay pattern mark and the B-type overlay pattern mark stitched together and exposed and measured by the scanning electron microscope. The method for measuring stitching overlay accuracy of image sensor stitching manufacturing of embodiment 1 can achieve direct metrology on the overlay pattern mark on the stitched pixel area of a product, facilitating timely and accurate monitoring on the stitching overlay accuracy of image sensor stitching manufacturing and more accurately and efficiently providing a predicted value of an overlay model of a super large image sensor. In addition, since basis patterns of the A-type overlay pattern mark and the corresponding B-type overlay pattern mark formed on the edge of each rectangular pixel area to be stitched are strip-shaped, patterns of wires at the edge of the same pixel area are consistent, thereby keeping the entire pattern of the pixel area natural.

Embodiment 2

According to the method for measuring stitching overlay accuracy of image sensor stitching manufacturing of embodiment 1, in step 3, by performing, by means of the scanning electron microscope, the metrology on the A-type overlay pattern mark and B-type overlay pattern mark that are stitched together and exposed, a distance A1 between the adjacent A-type intermediate strips and a distance B1 between the adjacent B-type intermediate strips are also obtained, and OVL=K−C−(A1−B1).

In the method for manufacturing a super large image sensor of embodiment 2, the determination of the stitching overlay accuracy OVL of the two adjacent rectangular pixel areas also considers the impacts of the stitching and exposure of the rectangular pixel areas on a distance A1 between the adjacent A-type intermediate strips and a distance B1 between the adjacent B-type intermediate strips, thereby eliminating the impacts of a change in the critical dimension (CD) of a process of preparing the rectangular pixel area on the stitching overlay accuracy OVL.

Embodiment 3

Based on the method for manufacturing a super large image sensor of embodiment 1, before the stitching and exposure, the width of the A-type intermediate strip, the width D1 of the body of the A-type side strip, the width of the B-type intermediate strip, and the width D2 of the B-type side strip are equal.

In some examples, before the stitching and exposure, the end of each B-type intermediate strip on the side far away from the pixel area center is located on a side of the two B-type side strips far away from the pixel area center.

In some examples, before the stitching and exposure, the end of each B-type intermediate strip on the side far away from the pixel area center is farther away from the pixel area center compared with the end of the B-type side strip on the side far away from the pixel area center, and a distance F from the end of each B-type intermediate strip on the side far away from the pixel area center to the end of the B-type side strip on the side far away from the pixel area center is about ½ of the length H of the head of the A-type side strip.

In some examples, before the stitching and exposure, the widths D1 of the bodies of the two A-type side strips and the width of each A-type intermediate strip are equal.

In some examples, before the stitching and exposure, ends of the two A-type side strips and N A-type intermediate strips close to the pixel area center are aligned.

Embodiment 4

Based on the method for manufacturing a super large image sensor of embodiment 1, before the stitching and exposure, the width I of the head of the A-type side strip is 2-5 times (e.g., 3 times) the width D1 of the body of the A-type side strip.

In some examples, before the stitching and exposure, the ends of the A-type intermediate strips on the side far away from the pixel area center are aligned and correspond to middle positions on the heads of the two A-type side strips, that is, a distance G from the end of the A-type intermediate strip on the side far away from the pixel area center to the end of the head of the A-type side strip on the side close to the pixel area center is ½ of the length H of the head of the A-type side strip.

Only some embodiments of the present application are described above, and are not intended to limit the present application. Any modifications, equivalent replacements, improvements, etc. made within the spirit and principles of the present application shall be included in the scope of protection of the present application.

What is claimed is:

1. A method for measuring stitching overlay accuracy of image sensor stitching manufacturing, comprising the following steps:

step 1, forming at least two rectangular pixel areas, wherein:

at least one A-type overlay pattern mark is formed on an upper edge of each pixel area, and at least one B-type overlay pattern mark is formed on a lower edge corresponding to an upper edge, at least one A-type overlay pattern mark is formed on a left edge, and at least one B-type overlay pattern mark is formed on a right edge corresponding to the left edge;

the A-type overlay pattern mark comprises two A-type side strips and N A-type intermediate strips, N being an integer greater than 1;

the two A-type side strips and N A-type intermediate strips are arranged in parallel;

the two A-type side strips are arranged on two sides of the N A-type intermediate strips;

each of the A-type side strips is composed of a body and a head connected together;

the body is located on a side close to a pixel area center;

the head is rectangular and located on a side far away from the pixel area center;

a width of the head is greater than a width of the body;

distances from the heads of the two A-type side strips to the A-type intermediate strips adjacent to the two A-type side strips are equal;

intervals between the A-type intermediate strips are equal;

ends of the A-type intermediate strips on the side far away from the pixel area center are aligned and located between the heads of the two A-type side strips;

the B-type overlay pattern mark is configured to cooperate with the A-type overlay pattern mark and comprises two B-type side strips and N B-type intermediate strips;

the two B-type side strips and N B-type intermediate strips are arranged in parallel;

the two B-type side strips are arranged on two sides of the N B-type intermediate strips;

ends of the B-type intermediate strips on the side far away from the pixel area center are aligned;

an interval between the B-type intermediate strips is equal to one of the intervals between the A-type intermediate strips; and distances E from the bodies of the two A-type side strips to the A-type intermediate strips adjacent to the two A-type side strips are equal to distances from the two B-type side strips to the B-type intermediate strips adjacent to the two B-type side strips;

step 2, performing left-right stitching and/or upper-lower stitching on the plurality of rectangular pixel areas, so that the A-type overlay pattern mark on an edge of two adjacent rectangular pixel areas is stitched to a corresponding B-type overlay pattern mark, wherein the heads of the two A-type side strips are in one-to-one correspondence with and stitched to ends of the two B-type side strips on the side far away from the pixel area center, with overlap areas, and the ends of the N A-type intermediate strips on the side far away from the pixel area center are in a one-to-one correspondence with and stitched to the ends of the N B-type intermediate strips on the side far away from the pixel area center, with overlap areas; and then forming a pattern after exposure; and step 3, performing, by means of a scanning electron microscope, metrology on the A-type overlay pattern mark and B-type overlay pattern mark that are stitched together and exposed, so as to obtain a distance K from the head of one of the A-type side strips to one of the B-type intermediate strips adjacent to the A-type side strip and a distance C from the head of the other A-type side strip to the B-type intermediate strip adjacent to the A-type side strip; and according to the distances from the heads of the two A-type side strips to the B-type intermediate strips adjacent to the A-type side strips, calculating stitching overlay accuracy OVL: OVL=K−C of the two adjacent rectangular pixel areas, wherein:

when the left-right stitching is performed on the two adjacent rectangular pixel areas, OVL is overlay accuracy of the left-right stitching; and when the upper-lower stitching is performed on the two adjacent rectangular pixel areas, OVL is overlay accuracy of the upper-lower stitching.

2. The method for measuring stitching overlay accuracy of image sensor stitching manufacturing according to claim 1, wherein:

before the stitching and exposure, a width of one of the A-type intermediate strips, the width D1 of the body of one of the A-type side strips, a width of one of the B-type intermediate strips, and a width D2 of one of the B-type side strips are 1-2 times of a critical dimension of a process of preparing one of the rectangular pixel areas.

3. The method for measuring stitching overlay accuracy of image sensor stitching manufacturing according to claim 1, wherein:
N is 2, 3, 4, or 5.

4. The method for measuring stitching overlay accuracy of image sensor stitching manufacturing according to claim 1, wherein:
in step 3, by performing, by means of the scanning electron microscope, the metrology on the A-type overlay pattern mark and B-type overlay pattern mark that are stitched together and exposed, a distance A1 between adjacent A-type intermediate strips and a distance B1 between adjacent B-type intermediate strips are also obtained, and OVL=K−C−(A1−B1).

5. The method for measuring stitching overlay accuracy of image sensor stitching manufacturing according to claim 1, wherein:
before the stitching and exposure, a width of one of the A-type intermediate strips, the width D1 of the body of one of the A-type side strips, a width of one of the B-type intermediate strips, and a width D2 of one of the B-type side strips are equal.

6. The method for measuring stitching overlay accuracy of image sensor stitching manufacturing according to claim 1, wherein:
before the stitching and exposure, an end of each B-type intermediate strip on the side far away from the pixel area center is located on a side of the two B-type side strips far away from the pixel area center.

7. The method for measuring stitching overlay accuracy of image sensor stitching manufacturing according to claim 6, wherein:
before the stitching and exposure, the end of each B-type intermediate strip on the side far away from the pixel area center is farther away from the pixel area center compared with an end of the B-type side strip on the side far away from the pixel area center, and a distance F from the end of each B-type intermediate strip on the side far away from the pixel area center to the end of the B-type side strip on the side far away from the pixel area center is equal to ½ of a length H of the head of the A-type side strip.

8. The method for measuring stitching overlay accuracy of image sensor stitching manufacturing according to claim 1, wherein:
before the stitching and exposure, widths of the bodies of the two A-type side strips and a width of each of A-type intermediate strips are equal; and
ends of the two A-type side strips and N A-type intermediate strips close to the pixel area center are aligned.

9. The method for measuring stitching overlay accuracy of image sensor stitching manufacturing according to claim 1, wherein:
before the stitching and exposure, the width I of the head of one of the A-type side strips is 2-5 times the width D1 of the body of the A-type side strip.

10. The method for measuring stitching overlay accuracy of image sensor stitching manufacturing according to claim 1, wherein:
before the stitching and exposure, the ends of the A-type intermediate strips on the side far away from the pixel area center are aligned and correspond to middle positions on the heads of the two A-type side strips, that is, a distance G from the end of the A-type intermediate strip on the side far away from the pixel area center to the end of the head of the A-type side strip on the side close to the pixel area center is ½ of a length H of the head of the A-type side strip.

* * * * *